United States Patent
Hu et al.

(10) Patent No.: US 7,397,124 B2
(45) Date of Patent: Jul. 8, 2008

(54) PROCESS OF METAL INTERCONNECTS

(75) Inventors: Shao-Chung Hu, Taipei (TW); Yu-Ru Yang, Ilan (TW); Chien-Chung Huang, Taichung Hsien (TW)

(73) Assignee: United Microelectronics Corp., Hsinchu (TW)

( * ) Notice: Subject to any disclaimer, the term of this patent is extended or adjusted under 35 U.S.C. 154(b) by 212 days.

(21) Appl. No.: 11/155,729

(22) Filed: Jun. 16, 2005

(65) Prior Publication Data
US 2005/0250312 A1  Nov. 10, 2005

Related U.S. Application Data

(62) Division of application No. 10/718,897, filed on Nov. 20, 2003, now abandoned.

(51) Int. Cl.
*H01L 23/48* (2006.01)

(52) U.S. Cl. ....................... 257/756; 257/758
(58) Field of Classification Search .......... None
See application file for complete search history.

(56) References Cited

U.S. PATENT DOCUMENTS 6,689,689 B1 * 2/2004 Besser et al. ............... 438/687
6,794,755 B2 * 9/2004 Maiz et al. .................. 257/758

* cited by examiner

*Primary Examiner*—Kiesha L Rose
(74) *Attorney, Agent, or Firm*—J.C. Patents (57) ABSTRACT

A process of metal interconnects and a structure of metal interconnect produced therefrom are provided. An opening is formed in a dielectric layer. A metal layer is formed over the dielectric layer filling the opening. A film layer is formed on the metal layer and the dielectric layer. The film layer is reacted with the metal layer during a thermal process, and a protective layer is formed on the surface of the metal layer. The portion of the film layer not reacted with the metal layer is removed to avoid short between the metal layers. The protective layer can protect the surface of the metal layer from being oxidized and thus the stability and the reliability of the semiconductor device can be effectively promoted.

14 Claims, 8 Drawing Sheets

PROCESS OF METAL INTERCONNECTS

CROSS-REFERENCE TO RELATED APPLICATION

This application is a divisional application of, and claims the priority benefit of U.S. application Ser. No. 10/718,897 filed on Nov. 20, 2003, now abandoned which claims the priority benefit of Taiwan application Ser. No. 92131480, filed Nov. 11, 2003.

BACKGROUND OF THE INVENTION

1. Field of the Invention

The present invention relates to a structure and a process of a semiconductor. More particularly, the present invention relates to a structure and a process of metal interconnects.

2. Description of the Related Art

After semiconductor fabrication processes reach to a deep sub-micron generation, integration of integrated circuit devices has been greatly enhanced. Deep sub-micron processes, however, has encountered certain problems arising from characteristics of the devices and properties of the materials. Certain characteristics, such as the resistance of the material and electromigration resistivity of aluminum interconnects, are unable to meet the needs of the deep sub-micron processes, which represents one of the pressing problems that need to be solved for fabricating integrated circuits.

In processes of fabricating integrated circuits, technologies of using aluminum to form metal interconnects have become rather mature. In a deep sub-micron process of semiconductor fabrication, however, copper is often used in place of aluminum to form interconnects. This is because copper has an electromigration resistivity 30 to 100 times higher than that of aluminum, a dielectric resistivity 10 to 20 times lower than that of aluminum, and an electric resistivity 30% lower than that of aluminum. Thus, the formation of inter-metal dielectrics by using copper to form metal interconnects in company with use of a material with low dielectric constant (low K) inter-metal can effectively lower resistivity-capacitance delay (RC delay) and increase elelectromigration resistivity.

Figure 1:
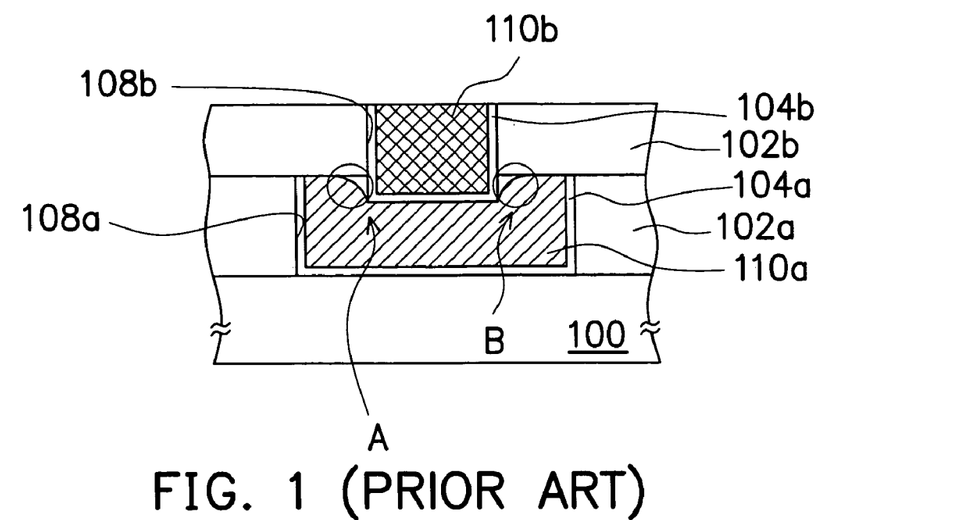
FIG. 1 is a schematic sectional view of a structure of the conventional metal interconnects.

Referring to FIG. 1, since copper is not easy to be etched, metal interconnects using copper are mostly fabricated by using a method of damascene. In other words, as shown in FIG. 1, a substrate 100 having many preformed devices (not shown) thereon is first provided. A dielectric layer 102a is then formed over the substrate 100 to cover the foregoing devices. The dielectric layer 102a has a damascene opening 108a of a wiring region for connecting with the substrate 100. In the damascene opening 108a is formed a barrier layer 104a, and subsequently a copper metal layer 110a to fill in the damascene opening 108a. The excess portion of the copper metal layer 110a that is outside of the damascene opening 108a is removed through a chemical mechanical polishing method. Over the dielectric layer 102a and the copper metal layer 110a, another dielectric layer 102b is formed having a damascene opening 108b for connecting with the copper metal layer 110a. A barrier layer 104b is formed in the damascene opening 108b, and then a copper metal layer 110b is filled into the damascene opening 108b. Further, the excess portion of the copper metal layer 110b that is outside of the damascene opening 108b is removed to form a structure of metal interconnects.

However, since copper is easy to be oxidized, in the foregoing fabrication processes of a damascene structure, copper oxide is easily formed on the surface of the copper metal layers 110a/110b, which increases electric resistivity of the copper metal layers 110a/110b, and lowers efficiency of the metal interconnects. In addition, copper is a relatively soft metal and the copper oxide formed on the surface of the copper is rather loose, and thus the surface properties of copper are difficult to be controlled, which will induce formation of undercut profile on the copper metal layers 110a/110b, as shown at A and B in FIG. 1, during a process of wet etching or wash with a solvent. Moreover, the formation of copper oxide on the surface of the copper metal layers 110a/110b may also have negative effects to adhesion between the copper metal layers 110a/110b and the barriers layers 104a/104b.

SUMMARY OF THE INVENTION

Accordingly, an object of the present invention is to provide a structure and a process of metal interconnects for avoiding oxidation on the surface of a metal layer and enhancing electric resistivity.

Another object of the present invention is to provide a structure and a process of metal interconnects for increasing process margin so as to enhance the efficiency of metal interconnection.

In accordance to the above objects and other advantages of the present invention, as broadly embodied and described herein, the present invention provides a structure of metal interconnects. The structure comprises a substrate, a dielectric layer, a metal layer and a protective layer. Wherein, the dielectric layer has an opening, a metal layer is filled in the opening, and the protective layer is formed on the portion of the surface of the metal layer not covered by the dielectric layer.

The present invention provides a process of metal interconnects. During the process, a dielectric layer is formed to cover a plurality of devices preformed on a substrate. An opening is formed in the dielectric layer, a barrier layer and a metal layer are formed over the opening filling the opening, and a film layer is subsequently formed over the dielectric layer and the metal layer. A thermal process is performed to induce a reaction at the interface between the film layer and the metal layerto form a protective layer on the surface of the metal layer. Subsequently, the portion of the film layer not reacted with the metal layer is removed.

As shown in the foregoing, the present invention provides a structure of metal interconnects comprising a protective layer over the metal layer, so as to avoid negative effects on either the efficiency of the entire devices or the stability of the process due to unexpected oxidation reactions occurring on the metal layer during the subsequent process steps.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 2A:
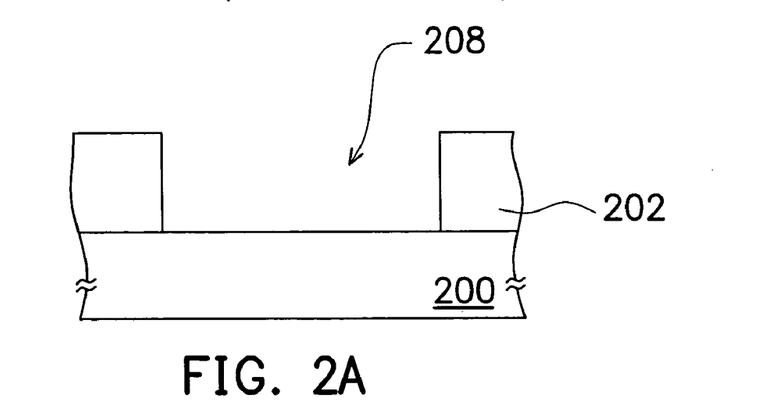
FIGS. 2A~2J are schematic sectional views showing a process of metal interconnects according to one preferred embodiment of the present invention.

FIGS. 2A~2J are schematic sectional views showing a process of metal interconnects according to one preferred embodiment. Referring to FIG. 2A, the process first provides a substrate 200, whereon many devices (not shown) are preformed. A dielectric layer 202 is formed on the surface of the substrate 200 to cover the foregoing devices. An opening 208 is formed in the dielectric layer 202. The opening 208 is, for example, a damascene opening for constructing a structure of dual damascene or a trench for constructing a metal wiring, or a dielectric via or a contacting opening for constructing a plug, or any opening for constructing metal interconnects (the opening 208 is shown in the figures only as a trench for constructing a metal wiring). The process to form the opening 208 is, for example, photolithographic etching.

Figure 2B:
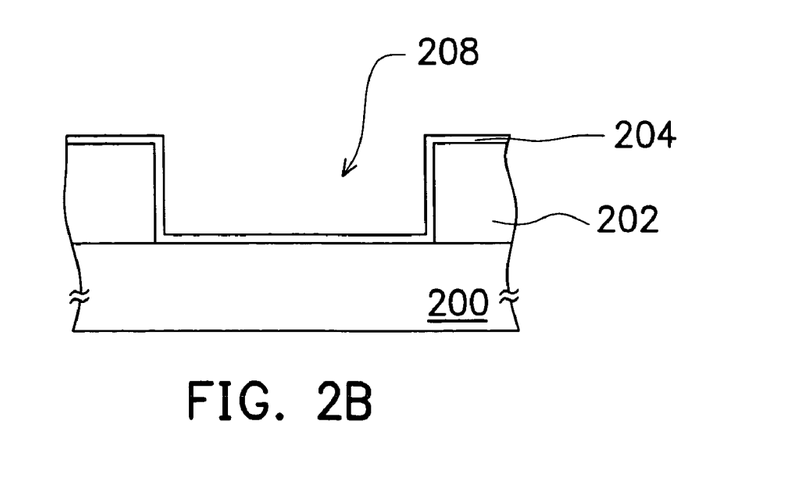

Then, referring to FIG. 2B, a barrier layer 204 is formed on the surfaces of the opening 208 and the dielectric layer 202. The material of the barrier layer 204 is, for example, tantalum nitride, titanium oxide, or nitride of titanium-silicon. When the material is tantalum nitride, the process of forming the barrier layer 204 is, for example, first depositing a tantalum layer to cover the dielectric layer 202 via a magnetron DC sputtering, then nitrifying tantalum to form tantalum nitride at a high temperature and under an atmosphere of nitrogen or ammonia. In addition, methods of forming the barrier layer 204 also include a step of reactive sputtering, wherein tantalum is used as a metal target, and ions in the gaseous mixture of argon and nitrogen bombard the metal target. Tantalum sputtered from ion bombardment will react with nitrogen atom generated from decomposition reactions occurred in plasma to form tantalum nitride. The resulting tantalum nitride then deposits on and covers the dielectric layer 202.

Figure 2C:
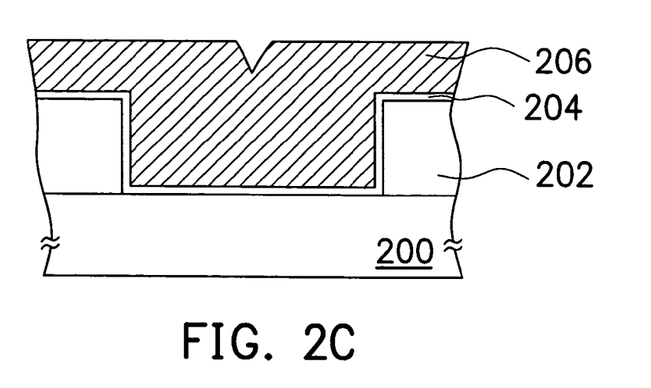

Further, referring to FIG. 2C, a metal layer 206 is formed over the barrier layer 204 filling the opening 208. The metal layer 206 is comprised of, for example, copper. The method of forming the copper metal layer 206 is, for example, physical vapor deposition (PVD) or chemical vapor deposition (CVD).

Figure 2D:
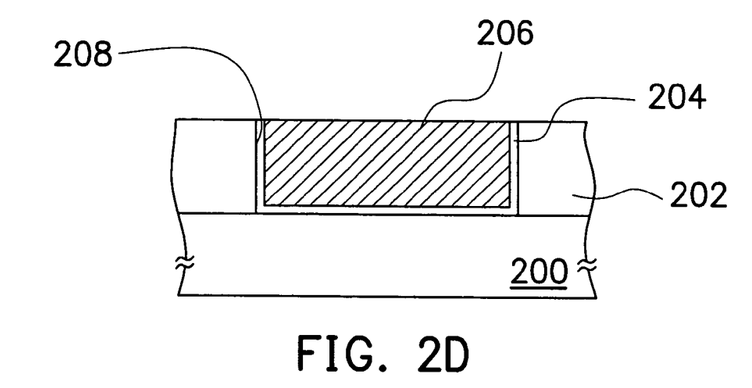
Figure 2E:
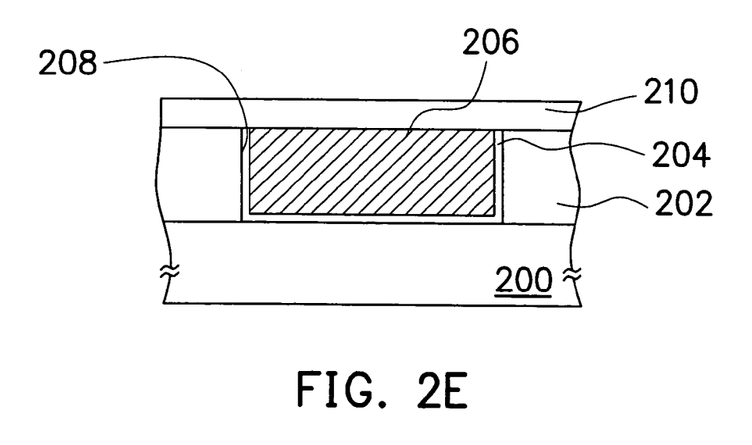

Referring to FIG. 2D, a portion of the copper metal layer 206 and a portion of the barrier layer 204 outside the opening 208 are removed by performing a chemical mechanical polishing (CMP) or etching. Referring to FIG. 2E, a film layer 210 is deposited on the dielectric layer 202 and the copper metal layer 206. The film layer 210 has a thickness of, for example, 10 Å~500 Å, and can be made of, for example, a conductive or non-conductive material. Examples of the conductive material are, but not limited to, stannum (Sn), aluminum (Al), or stannum-lead alloy (Sn—Pb).

Figure 2F:
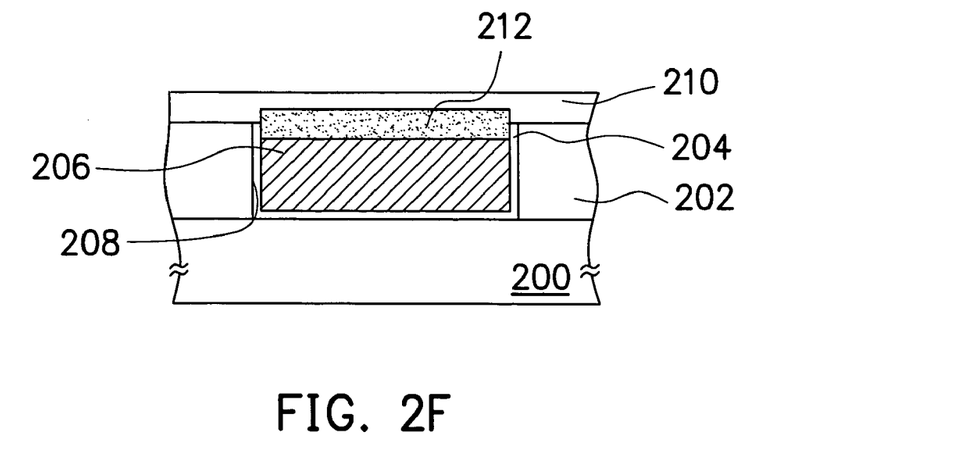

FIG. 2F shows a protective layer 212 formed via a reaction between the film layer 210 and the copper metal layer 206 in a thermal process. During the thermal process, the film layer 210 reacts with the copper metal layer 206, but not with the dielectric layer 202, via either dissolution or chemical reactions. Thus, the protective layer 212 is formed on the surface of the copper metal layer 206 to protect the copper metal layer 206 from being oxidized. In addition, the protective layer 212 is formed from a mixture of copper and the material of the film layer 210, such as a solid solution or compound of copper. Moreover, the temperature of the thermal process is controlled within an appropriate range, such as below 400° C., to avoid negative effect on other portions of the structure due to excessively high temperature and to lower costs of thermal supply in the process.

Figure 2G:
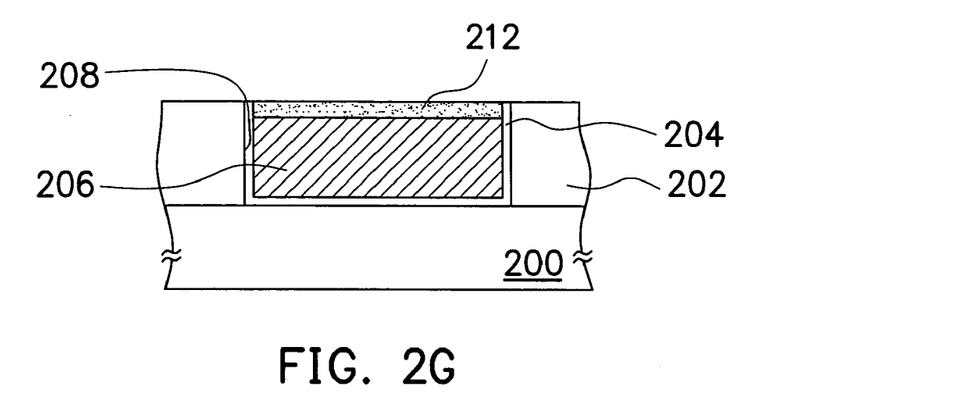

Referring to FIG. 2G, the portion of the film layer 210 not reacted with the copper metal layer 206 is removed. The removal process is accomplished through chemical mechanical polishing (CMP) or dry/wet etching by using the dielectric layer 202 as CMP stop layer or etch stop layer. Thus the process of forming a conductive structure is completed. The conductive structure is of, for example, a plug, a trench, or a dual damascene.

Further referring to FIG. 2G, the conductive structure formed according to the foregoing method comprises the dielectric layer 202, the barrier layer 204, the metal layer 206 and the protective layer 212. Wherein, the dielectric layer 202 is formed over the substrate 200, and has an opening 208 therein to expose part of devices on the substrate 200. In addition, the barrier layer 204 is disposed on the surface of the opening 208, and the metal layer 206 is disposed over the barrier layer 204. The barrier layer 204 is provided to prevent the metal layer 206 from diffusing via ion diffusion during a thermal process into, for example, the dielectric layer 202, and thus avoid the problem of depth energy level. On the other hand, the metal layer 206 is provided to form electrical connections with other metal layers in a subsequent process. Further, the protective layer 212 is formed over the metal layer 206 to prevent the metal layer 206 from the surface being oxidized and thus avoid the increase of resistivity of the metal layer 206.

Figure 2H:
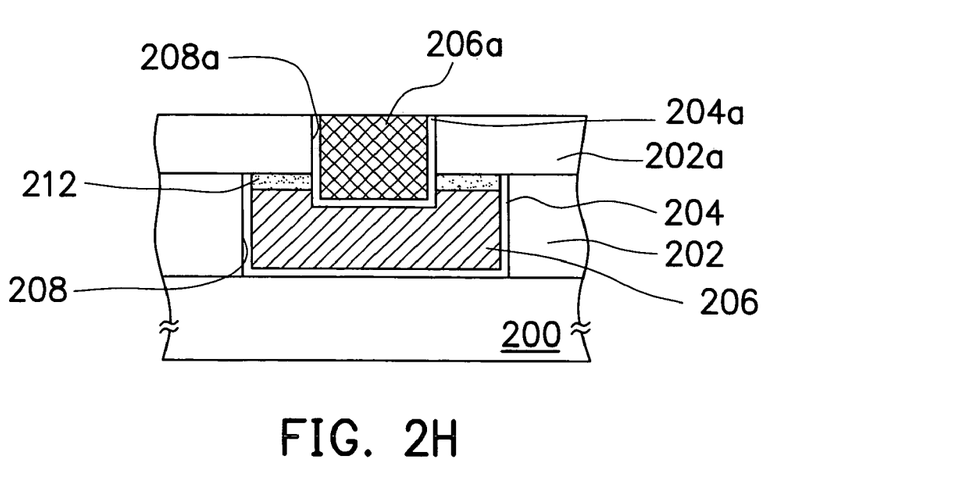

After the formation of the conductive structure as shown in FIG. 2G, another conductive structure can be subsequently formed over and in electric contact with the foregoing conductive structure. Referring to FIG. 2H, a dielectric layer 202a with an opening 208a therein is formed over the dielectric layer 202 and the protective layer 212. The opening 208a cuts through the protective layer 212 to expose a portion of the copper metal layer 206. Depending on the structure of the opening 208, the opening 208a can be in the form of a dual damascene, a trench, a dielectric layer opening, a contact opening, or an opening for forming a damascene structure. A barrier layer 204a is then formed on the surface of the opening 208a, and a metal layer 206a is formed over the barrier layer 204a filling the opening 208a. Subsequently, portions of the copper metal layer 206a and the barrier layer 204a, which are outside of the opening 208a, are removed via chemical mechanical polishing, whereas the other portions of the copper metal layer 206a and the barrier layer 204a, which are inside of the opening 208a, remain intact.

Figure 2I:
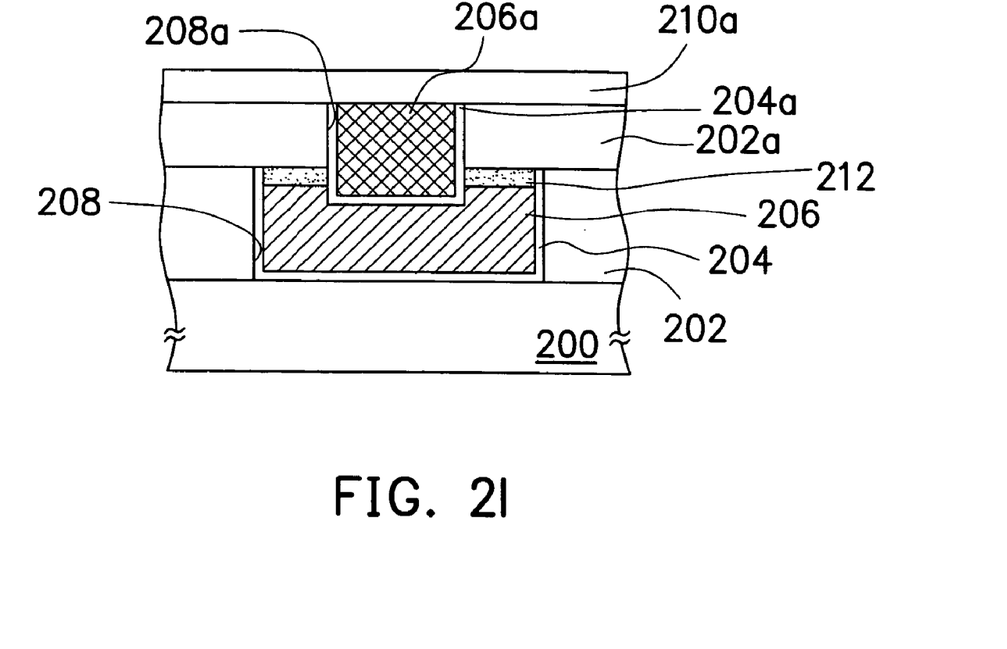
Figure 2J:
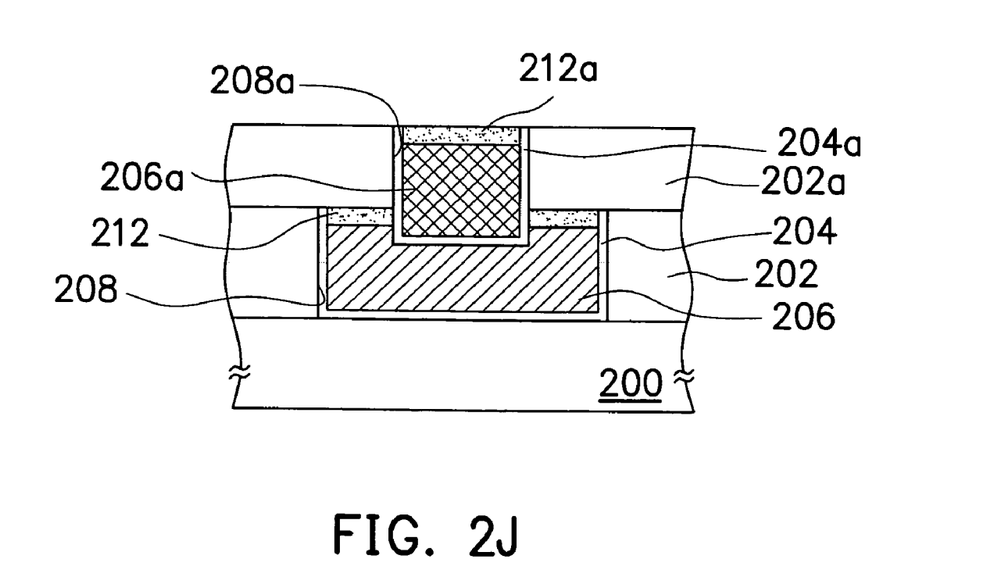

Referring to FIG. 2I, a film layer 210a is deposited over the dielectric layer 202a and the metal layer 206a. A thermal process is performed to induce a reaction on the interface between the film layer 210a and the copper metal layer 206a to form a protective layer 212a for protecting the copper metal layer 206a from the surface being easily oxidized. Referring to FIG. 2J, a process of chemical mechanical polishing or dry/wet etching is subsequently performed using the dielectric layer 202a as the chemical mechanical polishing stop layer or etch stop layer. The portion of the film layer 210a not reacted with the copper metal layer 206a is removed, and thus the conductive structure is constructed.

In the foregoing description, materials and fabrication methods of the metal layers 206 and 206a can be similar or identical. Materials and fabrication methods of the barriers layers 204 and 204a can be also similar or identical. Furthermore, materials and fabrication methods of the film layers 210 and 210a can be also similar or identical.

Further referring to FIG. 2J, the structure constructed according to the foregoing processes comprises the dielectric layer 202, the barrier layer 204, the metal layer 206, the protective layer 212, the dielectric layer 202a, the barrier layer 204a, the metal layer 206a and the protective layer 212a. Wherein, the dielectric layer 202 is formed over the substrate 200 and the dielectric layer 202 has an opening 208 therein to expose part of devices on the substrate 200. In addition, the barrier layer 204 is formed on the surface of the opening 208, and the metal layer 206 is formed over the barrier layer 206. The barrier layer 204 is provided to prevent the metal layer 206 from diffusing via ion diffusion during a thermal process into, for example, the dielectric layer 202, and thus avoid the problem of depth energy level. Whereas, the protective layer 212 is formed over the metal layer 206 to prevent the surface of the metal layer 206 from being oxidized and thus avoid the increase of resistivity of the metal layer 206. In addition, the dielectric layer 202a with an opening 208a therein is formed over the dielectric layer 202 and the protective layer 212. The opening 208a cuts through the protective layer 212 to expose a portion of the copper metal layer 206. Further, the protective layer 212a is formed on the surface of the metal layer 206a to prevent the metal layer 206a from the surface being easily oxidized and thus avoid the increase of resistivity of the metal layer 206a.

Another preferred embodiment of the present invention further comprises a stop layer formed on the dielectric layer. The stop layer is, for example, chemical mechanical polishing stop layer or etch stop layer to prevent the dielectric layer and the copper metal layer from excessive wear or etch.

FIGS. 3A~3K are schematic sectional views showing a process to form metal interconnects according to another preferred embodiment of the present invention. For clarity and simplicity in this preferred embodiment, structures and layers similar to those in the foregoing preferred embodiment are marked with identical numerical labels, and descriptions of materials or processes of the structures and layers are not further described.

Figure 3A:
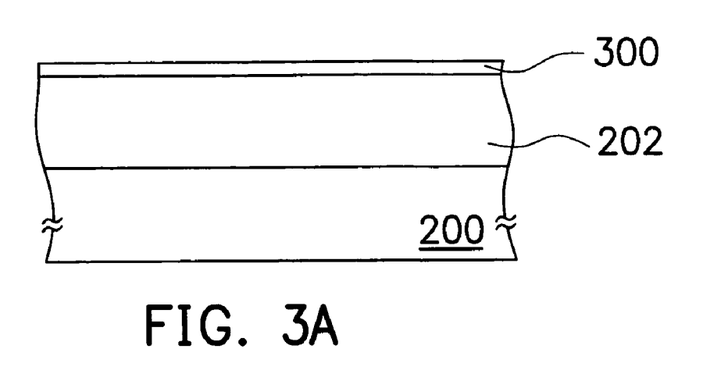
FIGS. 3A~3K are schematic sectional views showing a process of metal interconnects according to another preferred embodiment of the present invention.
Figure 3B:
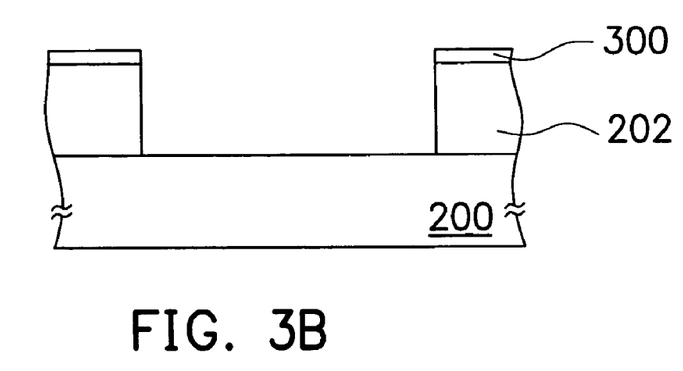
Figure 3C:
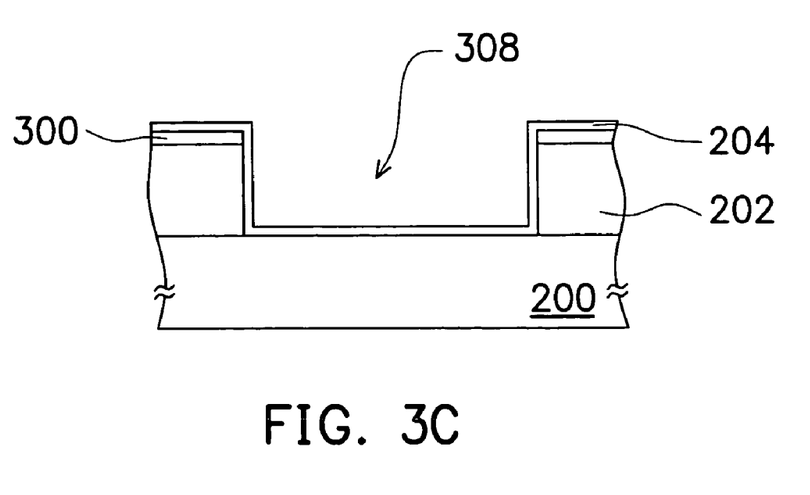
Figure 3D:
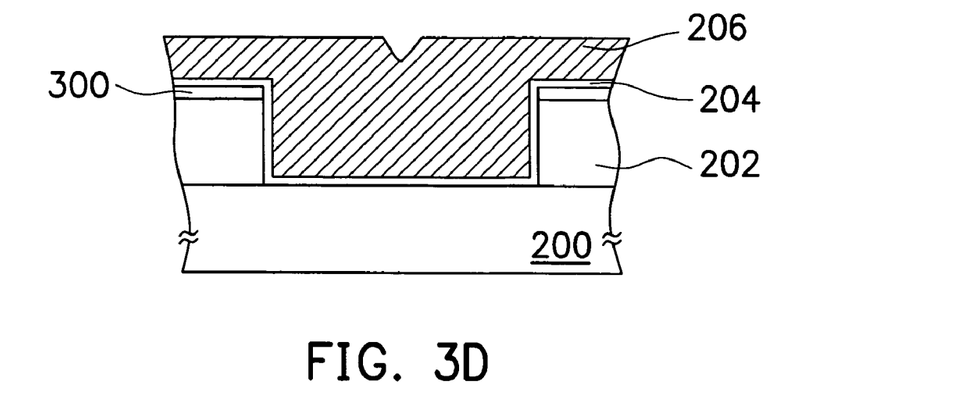
Figure 3E:
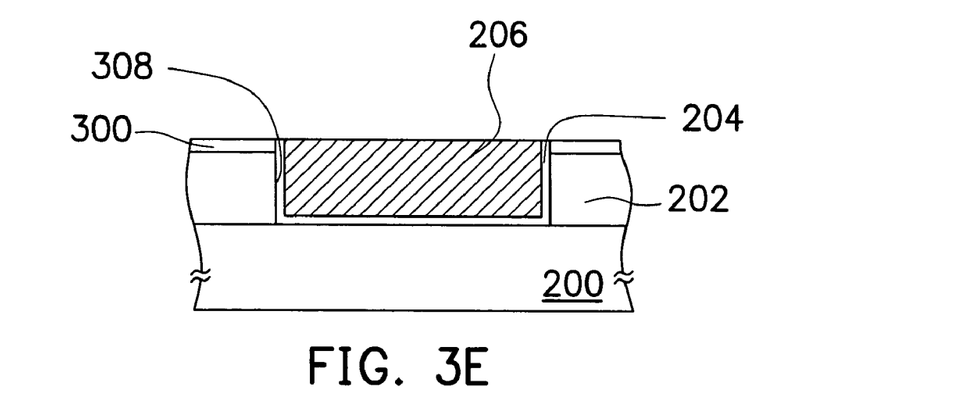

Referring to FIG. 3A, a substrate 200 having many preformed devices (not shown) thereon is first provided. A dielectric layer 202 is formed over the substrate 200 to cover the foregoing devices. A stop layer 300 is than formed over the dielectric layer 202. The stop layer 300 is, for example, a chemical mechanical polishing stop layer or an etch stop layer. Referring to FIG. 3B, an opening 308 is formed cutting through both the stop layer 300 and the dielectric layer 202 to expose a portion of the foregoing devices on the substrate 200. Referring to FIG. 3C, a barrier layer 204 is formed on the surfaces of the stop layer 300 and the opening 308. Referring to FIG. 3D, a metal layer 206 is formed over the barrier layer 204. Referring to FIG. 3E, the portions of the metal layer 206 and the barrier layer 204, which are outside the opening 308, are removed via chemical mechanical polishing process or etch process until the stop layer 300 is exposed, whereas the portions of the metal layer 206 and the barrier layer 204, which are inside the opening, remain intact. The chemical mechanical polishing process or etch process stops upon the exposure of the stop layer 300, such that the stop layer 300 can be used to avoid excessive polishing or etching and thus prevent the dielectric layer 202 and the metal layer 206 form being damaged.

Figure 3F:
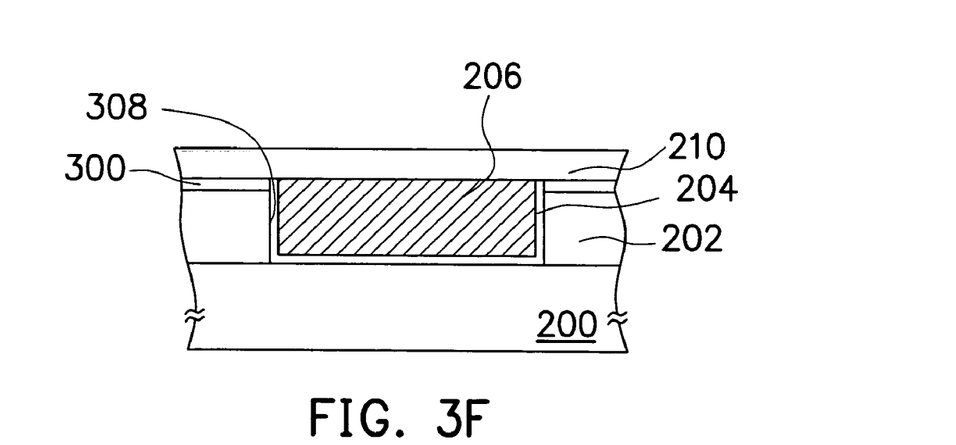
Figure 3G:
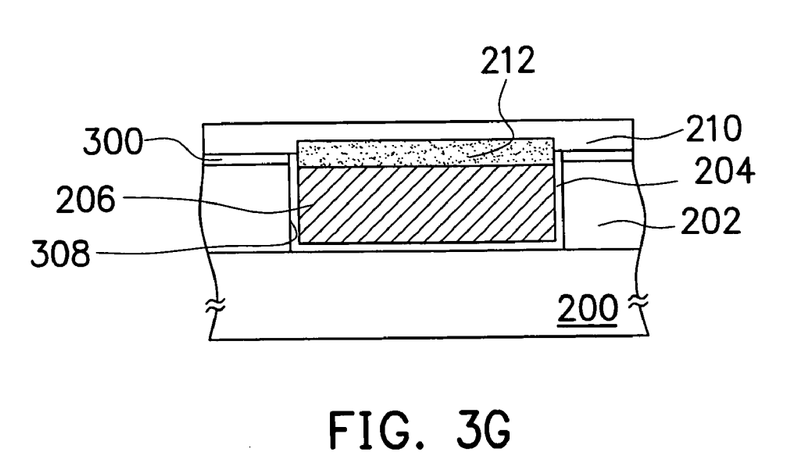
Figure 3H:
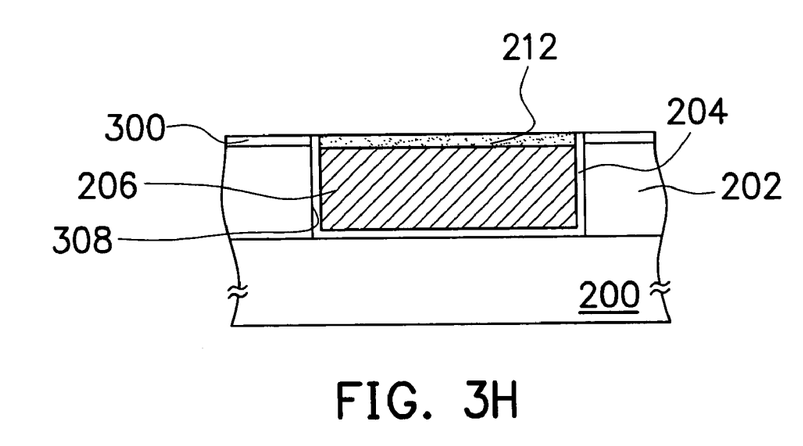

Referring to FIG. 3F, film layer 210 is formed over the metal layer 206 and the barrier layer 204. Then referring to FIG. 3G, a thermal process is performed, wherein the film layer 210 reacts with the copper metal layer 206, but not with the dielectric layer 202, via either dissolution or chemical reactions to form a protective layer 212. Thus, the protective layer 212 is formed on the surface of the copper metal layer 206 to prevent the copper metal layer 206 from being oxidized and avoid the increase of resistivity of the metal layer 206. Moreover, the temperature of the thermal process is controlled within an appropriate range, such as below 400° C., to avoid negative effect on other portions of the structure due to excessively high temperature and to lower costs of thermal supply in the process. Referring to FIG. 3H, the removal of the portion of the film layer 210 not reacted with the metal layer 206 is accomplished via a chemical mechanical polishing or dry/wet etching, whereupon the construction of the conductive structure is completed.

Further referring to FIG. 3H, the conductive structure formed according to the foregoing method comprises the dielectric layer 202, the CMP stop layer 300, the barrier layer 204, the metal layer 206 and the protective layer 212. Wherein, the dielectric layer 202 is formed over the substrate 200, and the stop layer 300 is over the dielectric layer 202. The stop layer 300 is comprised of, for example, silicon dioxide ($SiO_2$), silicon nitride (SiN), silicon oxynitride (SiON), silicon carbide (SiC), silicon carboxide (SiCO) or silicon oxycarbonitride (SiOCN). In addition, an opening 308 is formed in the stop layer 300 and the dielectric layer 202 to expose a portion of devices preformed on the substrate 200, the barrier layer 204 is formed on the surface of the opening 308 and the metal layer 206 is formed over the barrier layer 204. Further, the protective layer 212 is formed on the metal layer 206 to prevent it from being oxidized and avoid the increase of its resistivity.

Figure 3I:
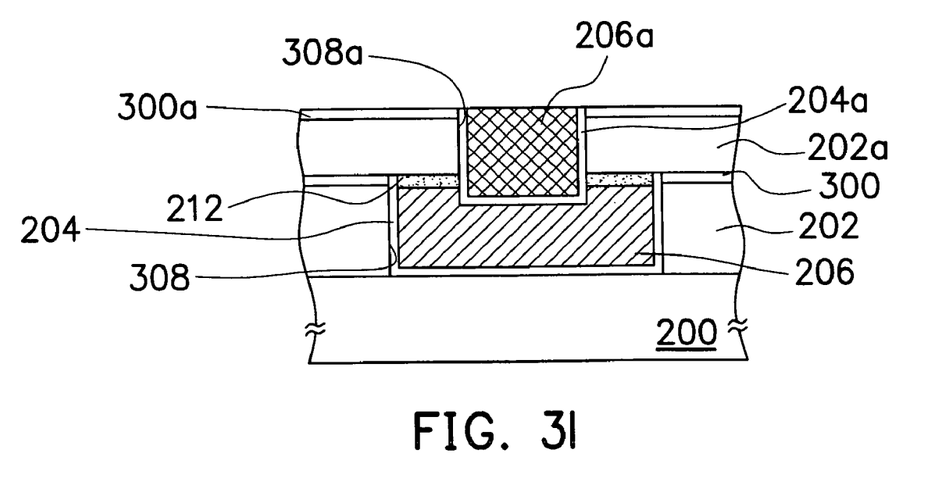
Figure 3J:
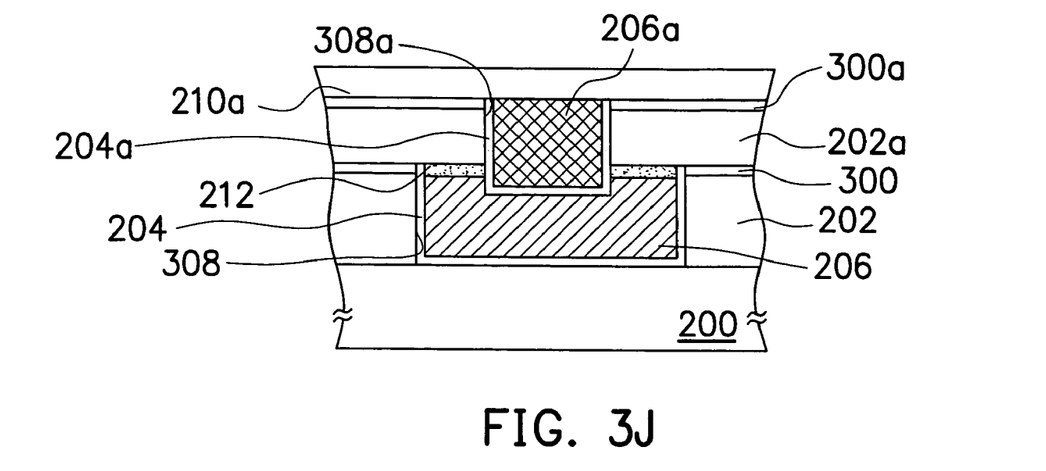
Figure 3K:
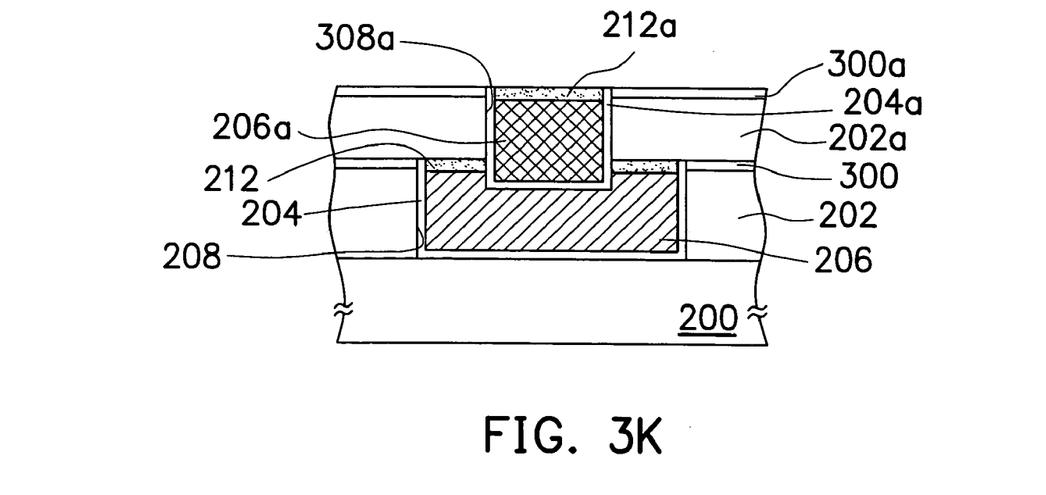

After the formation of the conductive structure as shown in FIG. 3H, another conductive structure can be subsequently formed over and in electrical contact with the foregoing conductive structure. Referring to FIG. 3I, another dielectric layer 202a is further formed over the stop layer 300 and the protective layer 212, and another stop layer 300a is formed over the dielectric layer 202a. An opening 308a is formed in the stop layer 300a and further through the dielectric layer 202a and the protective layer 212 for exposing a portion of the copper metal layer 206. Depending on the structure of the opening 308, the opening 308a can be in the form of a dual damascene, a trench, a dielectric layer opening, a contact opening, or a opening for forming a damascene structure. A barrier layer 204a is then formed on the surface of the opening 308a, and a metal layer 206a is formed over the barrier layer 204a filling the opening 308a. Subsequently, portions of the copper metal layer 206a and the barrier layer 204a, which are outside of the opening 308a, are removed via chemical mechanical polishing until the stop layer 300a is exposed, whereas the remaining portions of the copper metal layer 206a and the barrier layer 204a, which are within the opening 308a remain intact. Referring to FIG. 3J, a film layer 210a is deposited over the dielectric layer 300a and the metal layer 206a. Referring to FIG. 3K, a thermal process is performed to cause the film layer 210a to react with the copper metal layer 206a, but not with the stop layer 300a, via either dissolution or chemical reactions to form a protective layer 212a. Thus, the protective layer 212a is formed on the surface of the copper metal layer 206a to prevent the copper metal layer 206a from being oxidized and avoid the increase of resistivity of the metal layer 2061. Subsequently, for example, a chemical mechanical polishing or dry/wet etching is performed to remove the portion of the film layer 210a not reacted with the copper metal layer 206a, whereupon the construction of a conductive structure is completed.

Further referring to FIG. 3K, the structure formed in the foregoing process comprises the dielectric layer 202, the stop layer 300, the barrier layer 204, the metal layer 206, the protective layer 212, the dielectric layer 202a, the stop layer 300a, the barrier layer 204a, the metal layer 206a and the protective layer 212a. Wherein, the dielectric layer 202 is formed over the substrate 200, and the stop layer 300 is formed over the dielectric layer 202. The opening 308 is formed in the stop layer 300 and the dielectric layer 202 to expose a portion of devices on the substrate 200. Besides, the barrier layer 204 is formed on the surface of the opening 308, and the metal layer 206 is formed over the barrier layer 204. The protective layer 212 is formed on the surface of the metal layer 206 to prevent the metal layer 206 from its surface being oxidized and avoid the increase of the resistivity of the metal layer 206. In addition, the dielectric layer 202a with an opening 308a therein is formed over the stop layer 300 and the protective layer 212. The opening 308a cuts through the dielectric layer 202a and the protective layer 212 to expose a portion of the metal layer 206. Moreover, the barrier layer 204a is formed on the surface of the opening 308a, and the metal layer 206a is formed over the barrier layer 204a. Further, the protective layer 212a is formed on the surface of the metal layer 206a to prevent the metal layer 206a from its surface being oxidized and to avoid the increase of the resistivity of the metal layer 206a.

In the foregoing descriptions of preferred embodiments, copper is used as an example. The method of the present invention, however, is applicable to a process where other oxidizable metal is used, and thus is not limited to process of metal interconnects with copper as the material.

According to the present invention, the surface non-oxidizable protective layer is formed on the metal layer. The protective layer is provided to protect the metal layer to avoid the occurrence of undercut profile during a metal layer etching process, and to keep the original adhesion between the metal layer and the barrier layer by avoiding the decrease of the adhesion due to oxidation on the surface of the metal layer and thereby the metal layer is protected from any adverse effects affecting the material and electrical properties thereof. Therefore, the structure and process of the present invention is capable of enhancing the reliability of oxidizable metals and increase the process margin.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A process of forming metal interconnects, comprising:
   forming a first opening in a first dielectric layer;
   filling a first metal layer in the first opening;
   forming a first film layer on the first dielectric layer and the first metal layer;
   performing a thermal process to induce a reaction between the first metal layer and the first film layer to form a first protective layer on the surface of the first metal layer; and
   removing an unreacted portion of the first film layer.

2. The process according to claim 1, wherein the first metal layer is comprised of copper.

3. The process according to claim 1, wherein the first film layer is comprised of a conductive material or a non-conductive material.

4. The process according to claim 3, wherein the conductive material is selected from a group consisting of stannum (Sn), aluminum (Al), and stannum-lead alloy (Sn—Pb).

5. The process according to claim 1, wherein the first film layer has a thickness of between 10 Å~500 Å.

6. The process according to claim 1, wherein the thermal process is performed at a temperature lower than 400° C.

7. The process according to claim 1, further comprising a step of forming a first stop layer on the surface of the first dielectric layer before the step of forming the first opening in the first dielectric layer.

8. The process according to claim 1, after the step of removing unreacted portion of the first film layer, further comprising:
   forming a second dielectric layer on the first dielectric layer to cover the first protective layer;
   forming a second opening in the second dielectric layer to cut through the first protective layer and expose the first metal layer;
   filling a second metal layer in the second opening to electrically contact the first metal layer;
   forming a second film layer over the second dielectric layer and the second metal layer;
   performing a thermal process to induce a reaction between the second metal layer and the second film layer to form a second protective layer on the surface of the second metal layer; and
   removing an unreacted portion of the second film layer.

9. The process according to claim 8, wherein the second metal layer is comprised of copper.

10. The process according to claim 8, wherein the second film layer is comprised of a conductive material or a non-conductive material.

11. The process according to claim 10, wherein the conductive material is selected from a group consisting of stannum (Sn), aluminum (Al), and stannum-lead alloy (Sn—Pb).

12. The process according to claim 8, wherein the second film layer has a thickness of between 10 Å~500 Å.

13. The process according to claim 8, wherein the thermal process is performed at a temperature lower than 400° C.

14. The process according to claim 8, further comprising a step of forming a second stop layer on the surface of the second dielectric layer before forming the second opening in the second dielectric layer.

* * * * *